(12) United States Patent
Yudanov

(10) Patent No.: US 11,354,134 B1
(45) Date of Patent: Jun. 7, 2022

(54) PROCESSING-IN-MEMORY IMPLEMENTATIONS OF PARSING STRINGS AGAINST CONTEXT-FREE GRAMMARS

(71) Applicant: Micron Technology, Inc., Boise, ID (US)

(72) Inventor: Dmitri Yudanov, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/212,551

(22) Filed: Mar. 25, 2021

(51) Int. Cl.
| | |
|---|---|
| *G11C 11/413* | (2006.01) |
| *G06F 40/211* | (2020.01) |
| *G06F 9/38* | (2018.01) |
| *G06F 9/30* | (2018.01) |
| *G11C 11/4094* | (2006.01) |
| *H03K 19/1776* | (2020.01) |
| *H03K 19/17728* | (2020.01) |
| *G11C 11/408* | (2006.01) |
| *G06F 15/78* | (2006.01) |

(52) U.S. Cl.
CPC ........ *G06F 9/3887* (2013.01); *G06F 9/30079* (2013.01); *G06F 9/3836* (2013.01); *G06F 15/7807* (2013.01); *G11C 11/4085* (2013.01); *G11C 11/4094* (2013.01); *H03K 19/1776* (2013.01); *H03K 19/17728* (2013.01)

(58) Field of Classification Search
CPC ... G11C 11/413; G11C 11/419; G06F 40/211; G06F 40/205
See application file for complete search history.

(56) References Cited

U.S. PATENT DOCUMENTS

| | | | |
|---|---|---|---|
| 7,584,343 | B2 | 9/2009 | Kirsch |
| 2008/0180450 | A1 | 7/2008 | Dowling |
| 2009/0024826 | A1 | 1/2009 | Zhang et al. |
| 2009/0207642 | A1 | 8/2009 | Shimano et al. |
| 2010/0046306 | A1 | 2/2010 | Takahashi |
| 2010/0246243 | A1 | 9/2010 | Kobatake |
| 2016/0293253 | A1 | 10/2016 | Ogiwara et al. |
| 2017/0083434 | A1 | 3/2017 | Potash |

(Continued)

OTHER PUBLICATIONS

USPTO, Office Action for Application No. 17/123,829, dated Sep. 21, 2021.

(Continued)

*Primary Examiner* — Jacob Petranek
(74) *Attorney, Agent, or Firm* — Lowenstein Sandler LLP

(57) ABSTRACT

An example system implementing a processing-in-memory pipeline includes: a memory array to store a plurality of look-up tables (LUTs) and data comprising an input string; a logic array coupled to the memory array, the logic array to perform a set of logic operations on the data and the LUTs, the set of logic operations implementing a set of production rules of a context-free grammar to translate the input string into one or more symbols; and a control block coupled to the memory array and the logic array, the control block to control a computational pipeline by activating one or more LUTs of the plurality of LUTs, the computational pipeline implementing a parser evaluating the input string against the context-free grammar.

20 Claims, 13 Drawing Sheets

(56) References Cited

U.S. PATENT DOCUMENTS

| | | |
|---|---|---|
| 2018/0358086 A1 | 12/2018 | Goel |
| 2019/0066772 A1 | 2/2019 | Singh |
| 2019/0303749 A1 | 10/2019 | Appuswamy et al. |
| 2020/0294580 A1 | 9/2020 | Raj et al. |
| 2021/0134345 A1* | 5/2021 | Kwon ............... G11C 11/40618 |
| 2021/0149984 A1* | 5/2021 | Luo ..................... G11C 7/1006 |
| 2021/0349826 A1* | 11/2021 | Roy ................... G06F 13/1668 |

OTHER PUBLICATIONS

U.S. Appl. No. 16/932,524, filed Jul. 17, 2020.

U.S. Appl. No. 17/123,829, filed Dec. 16, 2020.

Fujita, Toru, et al., 2016 IEEE International Parallel and Distributed Processing Symposium Workshops, Department of Information Engineering, Hiroshima University, "Bitwise Parallel Bulk Computation on the GPU, with Application to the CKY Parsing for Context-free Grammars", 2016, 10 pages.

Nishimura, Takahiro, et al., IEEE Xplore, 2017 IEEE International Parallel and Distributed Processing Symposium Workshops, "Accelerating the Smith-Waterman Algorithm Using Bitwise Parallel Bulk Computation Technique on GPU", 2 pages, [downloaded from the internet: Mar. 25, 2021].

Wikipedia, "CYK algorithm", 7 pages, [downloaded from the internet: Mar. 25, 2021].

USPTO, Notice of Allowance U.S. Appl. No. 16/932,524, dated Aug. 10, 2021.

USPTO, Office Action for U.S. Appl. No. 16/932,524, dated Apr. 29, 2021.

USPTO, Notice of Allowance for U.S. Appl. No. 16/932,524, dated Dec. 8, 2021.

\* cited by examiner

Grammar 220

$$G = (N, \Sigma, P, S)$$
$$N = \{S, A, B\}$$
$$\Sigma = \{a, b\}$$
$$P = \{$$
$$\quad S \rightarrow AB$$
$$\quad S \rightarrow BA$$
$$\quad S \rightarrow SS$$
$$\quad A \rightarrow AB$$
$$\quad B \rightarrow BA$$
$$\quad A \rightarrow a$$
$$\quad B \rightarrow b$$
$$\}$$

Parse tree 230

Iterations

| 5 | S,A |     |   |     |   |
|---|-----|-----|---|-----|---|
| 4 | S,A | S,B |   |     |   |
| 3 | S,A | B   | ∅ |     |   |
| 2 | S,A | S,B | ∅ | S,A |   |
| 1 | A   | B   | A | A   | B |
|   | a   | b   | a | a   | b |

Input string 210

| INPUTS | | | OUTPUTS | |
|---|---|---|---|---|
| A | B | C$_{in}$ | SUM | CARRY$_{out}$ |
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

PROCESSING-IN-MEMORY IMPLEMENTATIONS OF PARSING STRINGS AGAINST CONTEXT-FREE GRAMMARS

TECHNICAL FIELD

Embodiments of the present disclosure are generally related to memory systems, and more specifically, are related to implementing reconfigurable processing-in-memory logic for parsing strings against context-free grammars.

BACKGROUND

A computer system can include one or more processors (such as general purpose processors, which can also be referred to as central processing units (CPUs) and/or specialized processors, such as application-specific integrated circuits (ASICs), field programmable gate arrays (FPGAs), graphic processing units (GPUs), etc.), which are coupled to one or more memory devices and use the memory devices for storing executable instructions and data. In order to improve the throughput of the computer system, various solutions can be implemented for enabling parallelism in computations.

BRIEF DESCRIPTION OF THE DRAWINGS

The present disclosure will be understood more fully from the detailed description given below and from the accompanying drawings of some embodiments of the present disclosure.

FIG. 2 schematically illustrates an example workflow of parsing an input string against a context-free grammar by the PIM system 100 operating in accordance with aspects of the present disclosure.

FIG. 5 schematically illustrates an example LUT utilized for implementing a PIM computational pipeline in accordance with aspects of the present disclosure.

DETAILED DESCRIPTION

Figure 1A:
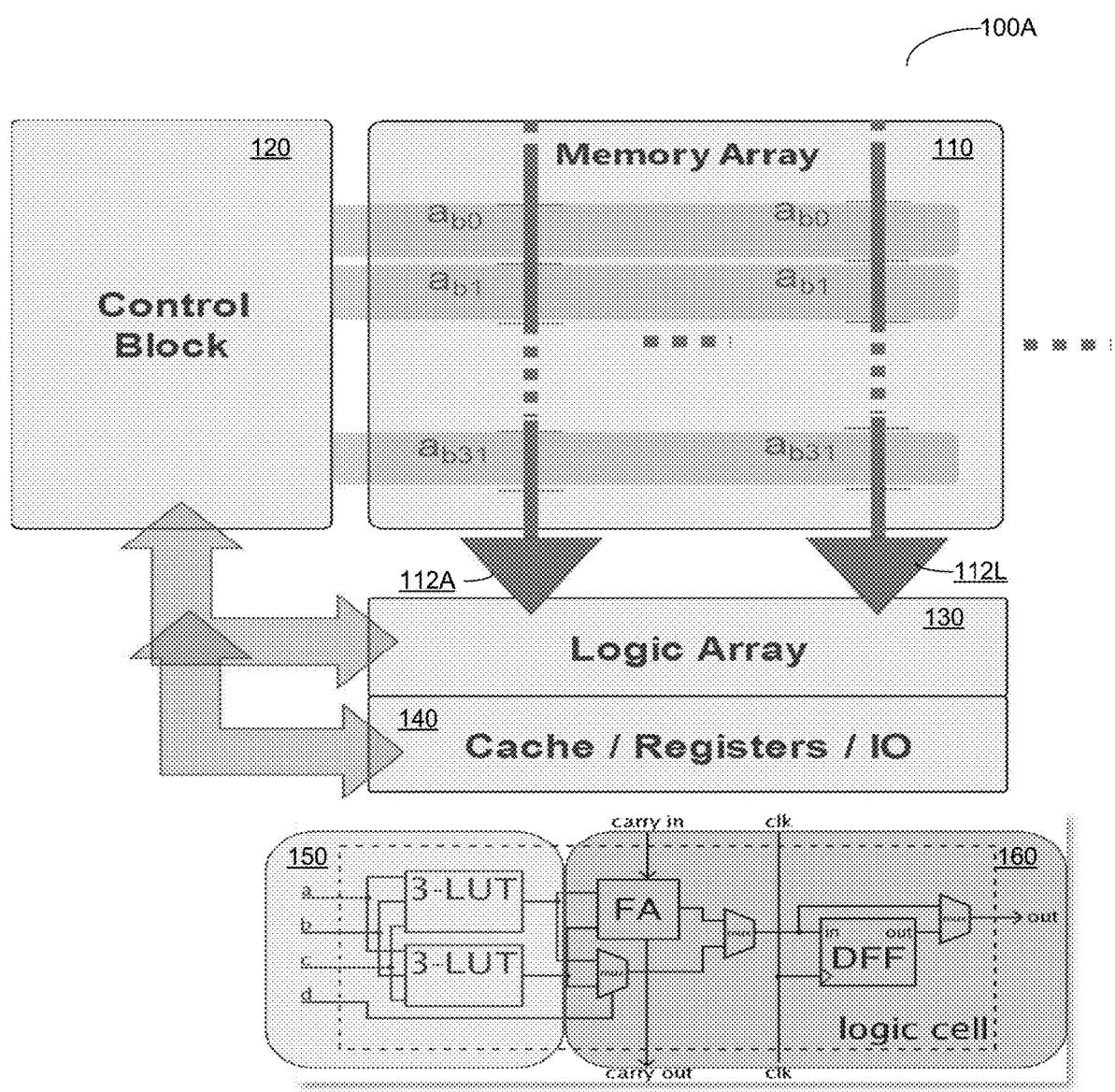
FIGS. 1A-1B illustrate high level architectural diagrams of example processing-in-memory (PIM) systems implemented in accordance with aspects of the present disclosure.

Embodiments of the present disclosure are directed to implementing reconfigurable processing-in-memory (PIM) logic for parsing strings against context-free grammars.

A computer system can include one or more processors (such as general purpose processors, which can also be referred to as central processing units (CPUs) and/or specialized processors, such as application-specific integrated circuits (ASICs), field programmable gate arrays (FPGAs), graphic processing units (GPUs), neural and artificial intelligence (AI) processing units (NPUs), etc.), which are coupled to one or more memory devices and use the memory devices for storing executable instructions and data. In order to improve the throughput of the computer system, various solutions can be implemented for enabling parallelism in computations. However, such solutions are often based on increasing the number of processing cores (such as GPU cores), thus increasing both the energy consumption and the overall cost of the computer system.

In order to improve the system throughput while avoiding exorbitant costs, embodiments of the present disclosure implement PIM operations by memory devices equipped with logic arrays and control blocks. The reconfigurable PIM logic can be utilized for implementing various computational pipelines, including highly parallel superscalar pipelines, vector pipelines, systolic arrays, hardware neural networks, and/or computational pipelines of other types. In some implementations, the reconfigurable PIM logic can be employed for parsing strings against context-free grammars, as described in more detail herein below. The parsers implemented in accordance with aspects of the present disclosure can be utilized for natural language processing, implementing compilers of formal languages (e.g., programming languages), and/or various other tasks related to languages defined by context-free grammars. In some embodiments, when optionally augmented with artificial intelligence (AI) features, these parsers can be utilized for speech and text synthesis, language translation, and, broadly speaking, for translating strings of symbols form one grammar set into another. These strings can encode textual, voice, visual, genomic and any other information that follows known rules or grammars.

In some embodiments, the reconfigurable PIM logic can implement the Cocke-Younger-Kasami (CYK) parser for context-free grammars. An example context-free grammar can be described as follows: $G=(N, \Sigma, P, S)$, where N is a set of non-terminal symbols, $\Sigma$ is a set of terminal symbols, P is a set of production rules, and $S \in N$ is the starting symbol. The parser computes the Boolean value of the function $f(G,x)$, which returns TRUE if the context-free grammar G derives the string $x=x_0 x_1 \ldots x_n$. In particular, the CYK parser can compute the value of $f(G,x)$ in $O(n^3)$ time (i.e., the computational complexity, which can be measured in units of time required to complete the computation, would be proportional to the cube of the number of substrings in the input string. Thus, the CYK parser can be employed to determine whether a given string is compliant with a specified set of grammar rules. The parser iteratively builds a parse tree, as described in more detail herein below.

Therefore, advantages of the systems and methods implemented in accordance with some embodiments of the present disclosure include, but are not limited to, providing more cost effective, with respect to various existing implementations, systems and methods for implementing various computational pipelines that can be employed, inter alia, for parsing strings against context-free grammars. In some embodiments, PIM systems implemented in accordance with aspects of the present disclosure can outperform specialized processors (such as application-specific integrated circuits (ASICs), field programmable gate arrays (FPGAs), graphic processing units (GPUs), etc.) for applications requiring wide circuits and large amounts of memory.

Figure 1B:
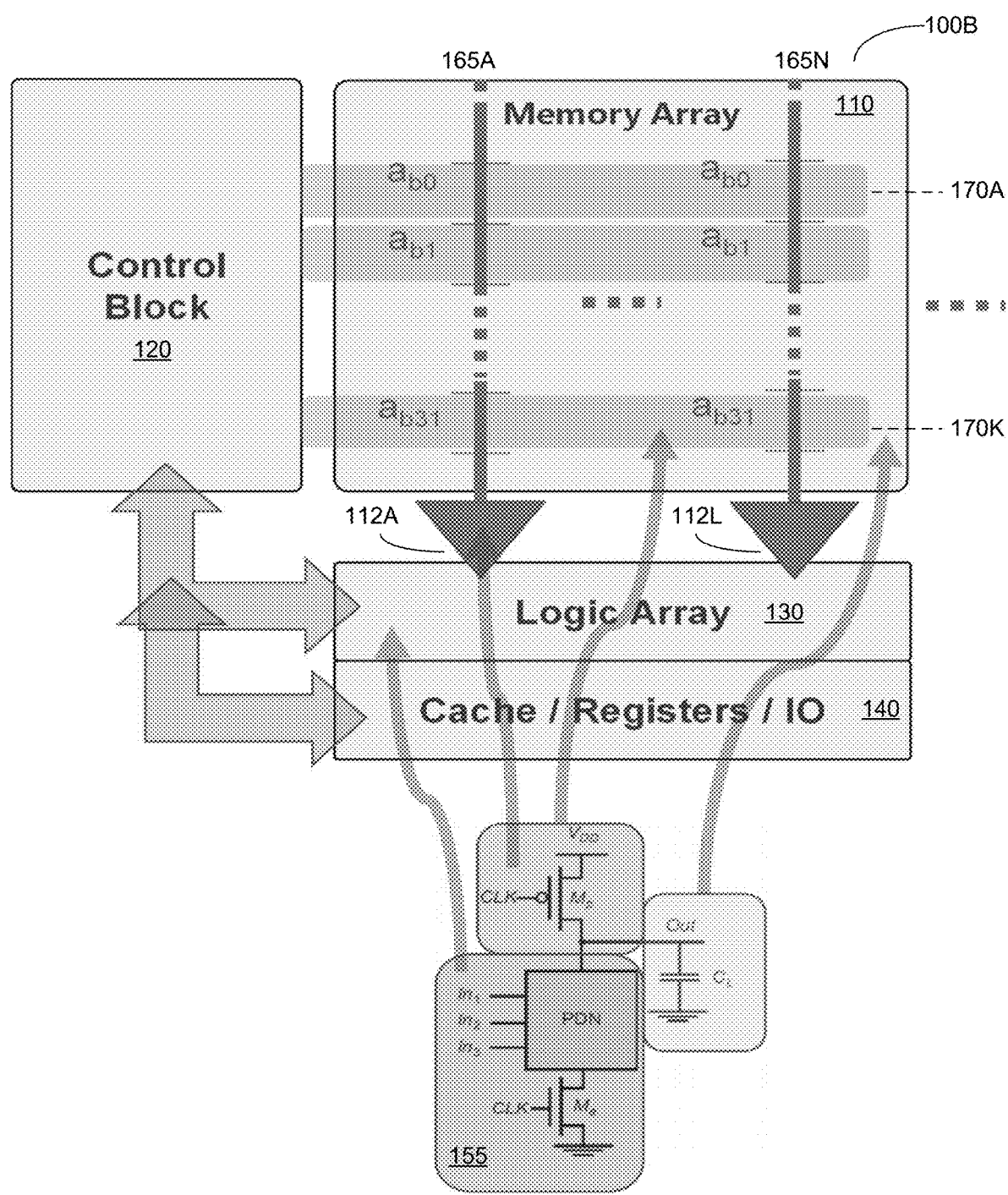

FIGS. 1A-1B illustrate high-level architectural diagrams of example PIM systems 100A-100B implemented in accordance with aspects of the present disclosure. As shown in FIG. 1A, the PIM system 100 includes the memory array 110 coupled to the control block 120, the logic array 130, and cache/registers memory 140. "Coupled to" herein refers to electrical connections between components, including indirect connections via one or more intervening components and direct connections (i.e., without intervening components).

In one embodiment, the PIM system 100 can be implemented as one or more integrated circuits located on a single chip. In another embodiment, the PIM system 100 can be implemented as a System-on-Chip, which, in addition to the components shown in FIG. 1, can include one or more processing cores and one or more input/output (I/O) interfaces. In some embodiments, the PIM system 100 can include various other components, which are omitted from FIG. 1 for clarity and conciseness. In some embodiments, the PIM system 100 can be implemented as a die stack of multiple die using die bonding or wafer bonding, such that each die may have a specific function such as memory, configurable logic, vector or scalar processor, systolic array and so on.

In one embodiment, the PIM system 100 can implement a CYK parser for context-free grammars. FIG. 2 schematically illustrates an example workflow of parsing an input string 210 against a context-free grammar 220 by the PIM system 100 operating in accordance with aspects of the present disclosure. In the illustrative example of FIG. 2, G represents an example context-free grammar, N denotes a set of non-terminal symbols of the input alphabet, $\Sigma$ denotes a set of terminal symbols of the input alphabet, P denotes a finite set of production rules, in which each production rule transforms a non-terminal symbols N to a string of non-terminal and/or terminal symbols N and/or $\Sigma$, and S denotes a start symbol. For a given input string x, the parser needs to define whether the input string $x=x_0 x_1 \ldots x_n$ is compliant with the context-free grammar G.

As schematically illustrated by FIG. 2, the parser iteratively splits the input string 210 into sets of substrings of varying sizes ranging from single-symbol substrings at the first iteration to the whole string at the last iteration. For every substring, the parser attempts to identify a sequence of one or more grammar states that can derive a given substring in accordance with the grammar rules, thus iteratively building a parse tree, which can be stored in a memory data structure 230. Each cell in the table 230 contains the identifiers of the grammar states that derive a corresponding substring, while the line number defines the substring size, such that line 1 of the table 230 contains the grammar states corresponding to single-symbol substrings of the input string, line 2 of the table 230 contains the grammar states corresponding to two-symbol substrings of the input string, line 3 of the table 230 contains the grammar states corresponding to three-symbol substrings of the input string, and so on, until the last line of the table 230 is reached, which contains the grammar state(s) corresponding to the input string. Thus, the cell of the table 230 at the intersection of i-th line and j-th column would contain the identifiers of the grammar states that derive the substring of size i starting from the element j of the input string. The input string x is derived from the start symbol S by applying production rules P of the grammar G if and only if the last cell of the first column (i.e., the cell at the intersection of line n and column 1, where n is the size of the input string x) of the table 230 contains the starting symbol S.

Figure 3:
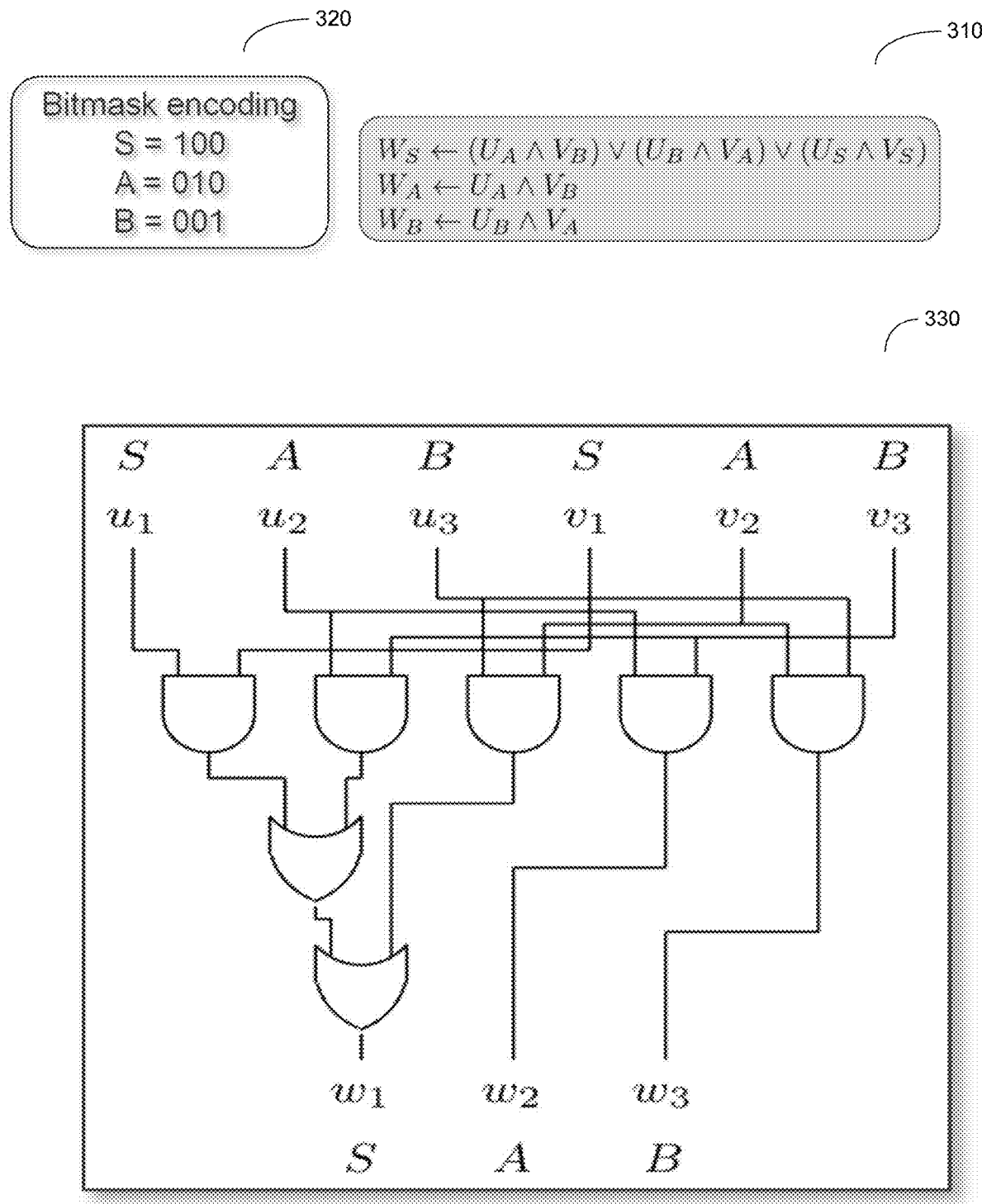
FIG. 3 schematically illustrates a processing logic encoding a rule set of a context-free grammar, implemented in accordance with aspects of the present disclosure.

The grammar rules P transforming non-terminal symbols of the input alphabet to corresponding strings of terminal and/or non-terminal symbols may be encoded by a set of logical statements 310, as schematically illustrated by FIG. 3. Each logical statement encodes one or more production rules transforming various combinations of non-terminal symbols to a given terminal symbol. Each combination of logical symbols specified by a right-hand side of a production rule is encoded by a logical conjunction (AND) operation, while two or more combinations of logical symbols are joined by logical disjunction (OR) operations. For example, the production rule S→AB is translated to $W_S = U_A \wedge U_B$, where $U_A$ and $U_B$ denote logical operation inputs corresponding to the non-terminal symbols A and B respectively, $\wedge$ denotes the logical conjunction (AND) operation, and $W_S$ denotes the logical operation result corresponding to the starting symbol S. The logical condition $U_A \wedge U_B$ encoding the right side of the production rule would evaluate to TRUE if an only if both $U_A$ and $U_B$ are TRUE, thus representing the original production rule translating AB to S.

If two or more productions rules define combinations of non-terminal symbols corresponding to the same terminal symbol, the right-hand sides of these production rules are joined by logical disjunction (OR) operations. For example, the right-hand sides of the production rules defining combinations of non-terminal symbols corresponding to the terminal symbol S in the example grammar 220 are joined together to form the following logical statement: $W_S = (U_A \wedge U_B) \vee (U_B \wedge U_A) \vee (U_S \wedge U_S)$, where $\vee$ denotes the logical disjunction (OR) operation.

Accordingly, the production rules of the example grammar 220 may be represented by the set of logical conditions 310, as schematically illustrated by FIG. 3. The set of logical conditions 310 may, in turn, be represented by the processing logic 330 of FIG. 3, which accepts the inputs $U_1$, $U_2$, and $U_3$ corresponding to the non-terminal symbols S, A, and B and produces outputs $W_1$, $W_2$, and $W_3$ corresponding to the non-terminal symbols S, A, and B. The non-terminal symbols S, A, and B can be encoded by the one-hot encoding, which produces, for each non-terminal symbol, a group of bits of a fixed size (which is three in the example of FIG. 3), such that all bits except for one are zeroes. Accordingly, the non-terminal symbols S, A, and B may be represented by their respective one hot encodings 320, as schematically illustrated by FIG. 3. The processing logic 330 evaluating the set of logical conditions may be implemented by a PIM pipeline 100 of FIG. 1, as described in more detail herein below.

In operation, the input alphabet symbols are encoded using the encodings 320, and the encoded inputs are fed to the processing logic 330, which produces the set of outputs that can be decoded using the encoding set 320 and stored in the memory locations representing the respective cells of the table 230.

Figure 4:
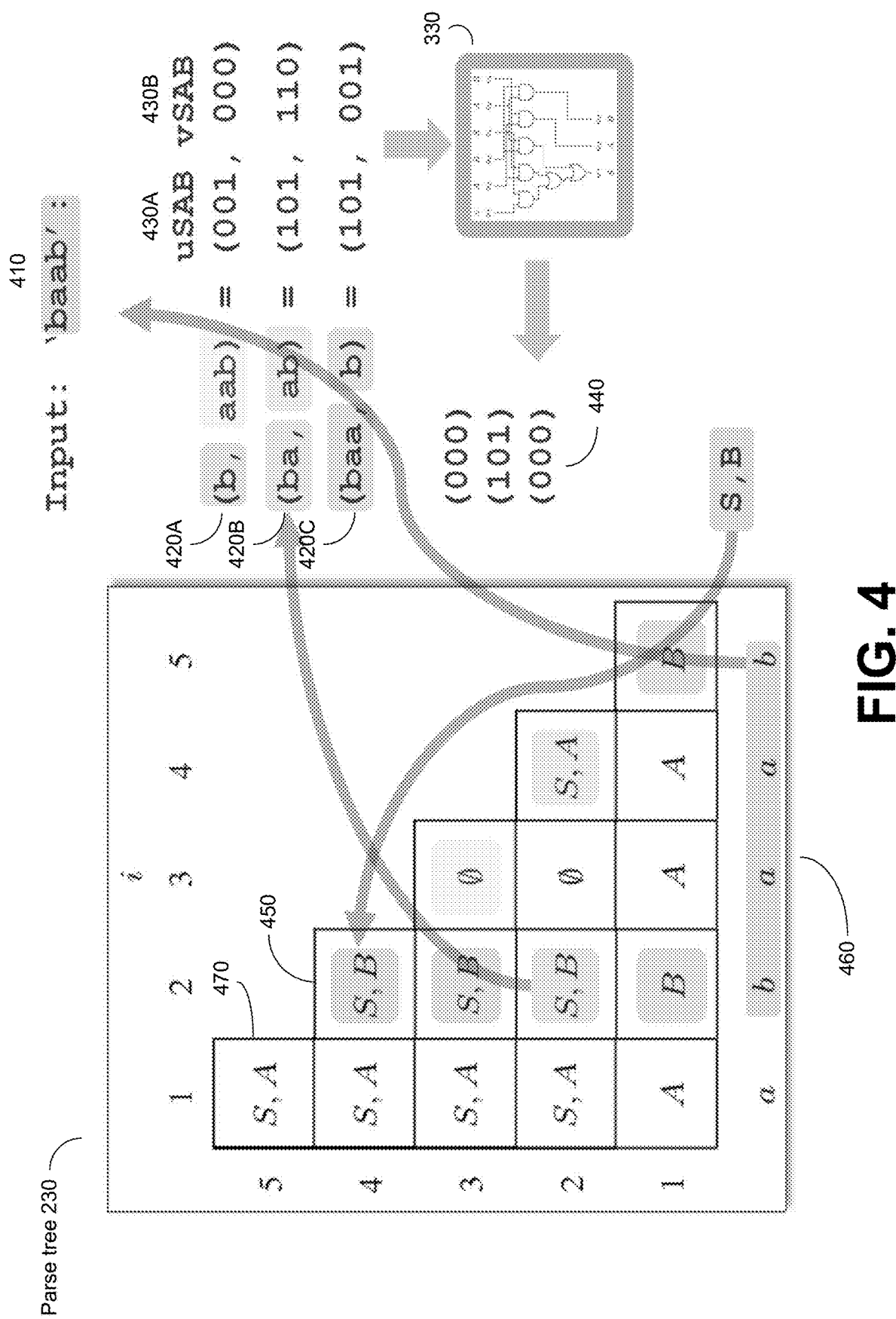
FIG. 4 schematically illustrates a workflow of processing an example input string by a PIM system operating in accordance with aspects of the present disclosure.

FIG. 4 schematically illustrates a workflow of processing an example input string 410 by the PIM system 100 operating in accordance with aspects of the present disclosure. As schematically illustrated by FIG. 4, the input string 410 is split into combinations of substrings 420A-420C, such that each combination includes two substrings of varying sizes ranging from a single symbol to the size of the input substring decremented by one. Each combination 420 is then encoded by concatenating the encodings 430A, 430B of the substrings comprised by the combination. The encodings 430 have been produced by the previous iteration of the method and stored in the memory data structure 230 implementing the CYK parse tree. As noted herein above, each cell in the table 230 contains the identifiers of the grammar states that derive a corresponding substring, while the line number defines the substring size. Thus, the cell of the table 230 at the intersection of i-th line and j-th column would contain the identifiers of the grammar states that derive the substring of size i starting from the element j of the input string. For each combination of substrings 420, its encodings 430 are fed to the processing logic 330, which produces the set of outputs 440 that can be decoded using the encoding set 320 and stored in the table cell 450 corresponding to the input substring 410. Specifically, in a simplified example of FIG. 4, the inputs 'b' and 'aab' encoded as 001 and 000 (the one-hot encoding for input 'aab' in terms of symbols [SAB] has been computed in one of the prior steps) produce output 000 after having been fed into processing logic 330, which encodes grammar G. To confirm the correctness of this intermediate result from the corresponding CYK step: 'b' is B and 'aab' is 0, and there are no production rules for BO (or presence of 0 rather nullifies any production rule), hence the outcome is 0. The inputs 'ba' and 'ab' encoded as 101 and 110 (the one-hot encodings for these inputs in terms of symbols [SAB] have been computed in one of the prior steps) produce output 101 after having been fed into processing logic 330. To confirm the correctness of this intermediate result from the corresponding CYK step: 'ba' is [S,B] and 'ab' is [S,A], and their combinations are SS, SA, BS, BA, among which there are combinations with rules in the grammar G (i.e. rules for SS and BA: S→SS, B→BA), hence the outcome is [S,B], which is with one-hot encoding corresponds to 101 since A is absent. The inputs 'baa' and 'b' encoded as 101 and 001 (the one-hot encoding for input 'baa in terms of symbols [SAB] has been computed in one of the prior steps) produce output 000 after having been fed feeding into processing logic 330. To confirm the correctness of this intermediate result from the corresponding CYK step: 'baa' is SB and 'b' is B, and their combinations are SB, BB, which don't have production rules, hence the outcome is 0.

While the above description illustrates computing a single cell in CYK table for the simplified example of FIG. 4, in more complex examples with thousands of symbols, the intensity of computations (measured, e.g., in terms of number of elementary mathematical operations) can be extremely high. Thus, PIM processors with embedded logic can provide significant advantages over various conventional computing technologies in efficiently performing such computations.

Similar operations can be iteratively performed for every combination of substrings of the initial string 460, until the last line of the table 230 is reached, the only cell 470 of which contains the grammar state(s) corresponding to the input string 460. By design of the CYK parser, the input string 460 is compliant with the grammar G, the rules of which are encoded by the processing logic 330, if and only if the cell 470 contains the starting symbol S.

As noted herein above, the processing logic 330 evaluating the set of logical conditions may be implemented by a PIM pipelines 100A-100B of FIGS. 1A-1B. As shown in FIG. 1A, the PIM systems 100A-100B include the memory array 110 coupled to the control block 120, the logic array 130, and cache/registers memory 140. "Coupled to" herein refers to electrical connections between components, including indirect connections via one or more intervening components and direct connections (i.e., without intervening components).

In one embodiment, the PIM system 100A-100B can be implemented as one or more integrated circuits located on a single chip. In another embodiment, the PIM system 100A-100B can be implemented as a System-on-Chip, which, in addition to the components shown in FIGS. 1A-1B, can include one or more processing cores and one or more input/output (I/O) interfaces. In some embodiments, the PIM system 100A-100B can include various other components, which are omitted from FIGS. 1A-1B for clarity and conciseness.

The memory array 110 can be provided by a dynamic random-access memory (DRAM) array or similar memory technologies including but not limited to 2D and 3D arrangements. The memory array 110 can be implemented as a matrix of memory cells addressable by rows (wordlines) and columns (bitlines), and in some cases additionally by using lines for selective enabling or masking memory accesses addressed by wordlines and bitlines. Each memory cell includes a capacitor that holds the electric charge and a transistor that acts as a switch controlling access to the capacitor.

In another embodiment, the memory array 110 can be provided by resistive random-access memory (ReRAM), including but not limited to 3D X-point memory. ReRAM can be implemented as a matrix of memory cells addressable by rows (wordlines) and columns (bitlines), including embodiments where rows and columns are symmetric (a row can play a role of column and a column can play a role of row). In some embodiments, ReRAM can include additional lines for selective enabling or masking memory accesses addressed by wordlines and bitlines. Each memory cell includes a resistive memory cell that holds its conductivity or resistivity state.

In another embodiment, the memory array 110 can be provided by Flash memory including but not 3D NAND Flash storage, which is a 3D matrix of memory cells addressable by planes (wordlines) and NAND strings (bitlines). Each memory cell includes a Flash transistor with a floating gate that holds its threshold voltage state (Vt) depending on the charge stored in a floating gate of the transistor.

In another embodiment, the memory array 110 can be provided by non-volatile hybrid FeRAM-DRAM memory (BRAM) array or similar memory technology, including but not limited to 2D and 3D arrangements. BRAM can be implemented as a matrix of memory cells addressable by rows (wordlines) and columns (bitlines). In some embodiments, BRAM can include additional lines for selective enabling or masking memory accesses addressed by wordlines and bitlines. Each memory cell includes a ferroelectric capacitor that holds the electric charge and a transistor that acts as a switch controlling access to the ferroelectric capacitor.

As schematically illustrated by FIG. 1A, the memory array 110 can be employed for storing the LUTs and data utilized for the computations, as well as the computation results. The LUTs can implement the logic that is utilized in parsing strings against context-free grammars, as described herein. Each LUT can implement an arithmetic or logic operation by storing one or more logic operation results in association with a look-up address comprising one or more logic operation inputs. In some embodiments, the PIM system 100 can further include a plurality of sense amplifiers 112A-112L coupled to the memory array. A sense amplifier can be employed to sense, from a selected bitline, a low power signal encoding the content of the memory cell and amplify the sensed signal to a recognizable logical voltage level, and optionally perform certain computations on the accessed data.

The cache/registers memory 140 can be implemented by a static random access memory (SRAM) array or by low-latency magnetoresistive random-access memory, including but not limited to magnetic tunnel junction (MTJ) memory cells. Cache/registers memory 140 can be employed for caching a subset of the information stored in the memory array 110. The SRAM array 140 can include multiple cache lines that can be employed for storing copies of the most recently and/or most frequently accessed data items residing in the memory array 110. In the illustrative example of FIG. 1A, the cache can be utilized to store copies of one or more LUTs to be utilized by the computational pipeline that is currently being executed by the control block 120, intermediate results produced by intermediate stages of the computational pipeline (for example, it could store binary encodings for substrings in the current iteration which will be used in subsequent iterations when parsing strings against context-free grammars, as described herein), and/or signals of the logic array 130. At least part of the SRAM array 140 can be allocated for registers, which store values of frequently updated memory variables utilized for computations.

The logic array 130 can include various logic components, such as full adders, half adders, multipliers, D-type flip-flops, and/or other components for implementing logic operations. Example logic operations are schematically shown as the functional block 150. In the illustrative example of FIG. 1A, the logic operations can implement reconfigurable processing logic by performing the logic operations on the LUTs (schematically shown as the function block 160) as they are activated by the control block 120 and/or on other data stored in the memory array 110 and/or in the cache/registers memory 140. Furthermore, the logic cells within the logic array 130 can exchange data amongst themselves. The logic operations performed by the logic array 130 can include, e.g., binary and bitwise disjunction (OR), conjunction (AND), exclusive disjunction (XOR), addition (ADD), etc. The logic array 130 can implement logic that is utilized in parsing strings against context-free grammars (for example the logic that represents rules of grammar G), as described herein.

In some embodiments, the logic array 130 can be implemented as a high-speed fabric interconnect with programmable flexible topology (e.g., cross-bar) and with included logic cells that can be programmed with data from the LUTs. In such embodiments, the LUT-based logic can perform much faster and can have much more flexible data exchange compared to PIM embodiments based on row buffer implementations. In these embodiments, the parser of strings against context-free grammars can be orchestrated as streaming binary encodings via a high-speed fabric interconnect.

As noted herein above, in the illustrative example of FIG. 1A, the memory array 110 can store multiple LUTs implementing various logic operations. The LUTs necessary for implementing a particular computational pipeline can be copied to the cache 140, such that the logic array 130 would be able to access the LUTs residing in the cache 140 without accessing the memory array 110. In some cases, the LUTs can be programmed to logic array 130 directly.

The logic array 130 can receive the inputs from the control block 120 and/or from the memory array 110, because the memory array 110 may, besides the LUTs, store the data utilized for the computations. In other words, the memory array 110 can store both the data to perform the computations on, as well as the LUTs implementing the computational logic. The control block 120 can process executable instructions (sequentially or in parallel), which can be stored in the memory array 110, thus implementing a von Neumann architecture in a manner that is conceptually similar to a regular computational pipeline (e.g. CPU or GPU pipeline): instruction fetch, decode, configure, and execute. These instructions can include instructions implementing parsing strings against context-free grammars, as described herein. Configuring an instruction can involve activating, by the control block 120, the wordlines storing the LUTs and the data. Executing the instruction(s) involves retrieving, by the logic array 130, the contents stored in the activated wordlines and performing, on the retrieved data, the logic operations specified by the control signals supplied by the control block 120. The result of the computations can be stored in the memory array 110 and/or outputted via an input/output (I/O) interface coupled to the memory (not shown in FIG. 1 for clarity and conciseness). Thus, the control block 120 can implement a computational pipeline, e.g., based on one or more copies of the processing logic 330 of FIG. 3, which can be replicated and/or cascaded. The control block can activate certain LUTs (e.g., by activating a memory array wordline in which a requisite row of the LUT is stored), thus making the LUTs available to the logic array 130.

The wordline drivers of the control block 120 that activate specific wordlines can reside on the same die with the memory array. In some embodiments, the processing core of the control block 120 can be also located on the same die, thus implementing a system-on-chip. Alternatively, the processing code can be located on a different die, as long as a physical connection providing a sufficient bandwidth and throughput between the processing core and the memory array is available. Multiple dies can be stacked atop each other, thus forming die stacks. The die stacks can be made by various technologies including but not limited to: TSV technology, die to die bonding, or wafer to wafer bonding techniques. In some embodiments, the control block can be implemented by an external processing core, such as a dedicated core of a CPU, which is controlled by a software driver.

In some embodiments, the control block 120 can receive its instructions for execution from the memory array 110 either via the logic array 130 or wordlines of memory array 110. The latter is possible if the memory array 110 is provided by resistive random-access memory (ReRAM), which is a matrix of memory cells addressable by rows (wordlines) and columns (bitlines), where rows and columns are symmetric (i.e., a row can play a role of a column and a column can play a role of a row). In this case, the sense amplifiers/drivers of logic array 130 provide sufficient driving strength via bitlines in order for sense amplifiers/drivers of the control block 120 to sense data.

Furthermore, due to symmetricity of data access, the functions of logic array 130 and control block 120 can in some embodiments be merged such that control block 120 can also implement functions of logic array 130, and logic array 130 can also implement functions of control block 120. As a result, such embodiments may have symmetric two blocks per array (connected to the memory array 110 from the left and bottom of the memory array 110). Furthermore, in some embodiments, the two blocks can be further expanded to four symmetrical blocks (connected to the memory array 110 from left, right, bottom, and top of the memory array 110). In these embodiments, the parser of strings against context-free grammars described herein can be orchestrated as synchronous or asynchronous exchange of computation results among symmetrical blocks. In some embodiments, the PIM system can be implemented as a layered chip, in which the memory array 110 and the control block 120 are located within two different layers of the same die.

FIG. 5 schematically illustrates an example LUT utilized for implementing a PIM computational pipeline in accordance with aspects of the present disclosure. As shown in FIG. 5, LUT 500 implementing the add-with-carry operation of three bit inputs A, B, C (full adder). The LUT 500 has one column for each of the operands A, B, C, and two columns for the results: one column for the single-bit sum of the operands, and one column for the carry bit. Accordingly, each line of the LUT includes a combination of the operands A, B, C, and the corresponding values of the single-bit sum and the carry bit. Various other arithmetic and logic operations can be implemented in a similar manner, by storing in the memory array their respective truth tables in a form of a LUT. A truth table stores at least a subset of all possible combinations of the operation arguments (operands) together with the corresponding operation results. For example, the logic that is utilized in parsing strings against context-free grammars and depicted in FIG. 3 can be stored as a group of truth tables implementing OR and AND gates, and possibly other gates that implement the circuit with the same functionality. The control block 120 can, at every stage of the computational pipeline, select, from the LUT, the row which corresponds to the current values of the bit inputs. The control block 120 can further activate the wordline that is identified by a sum of the base address of the LUT and the offset of the requisite row in the LUT with respect to its based address.

In some embodiments, the LUTs can be cached in cache 140 by interleaving the computations performed by logic array 130 with memory accesses (e.g. while the logic array 130 performs computations on one part of LUTs, another part of the LUT can be read from the memory array 110 and stored in the cache 140). The computation results from the cache 140 can be stored to memory array 110 in a similar manner.

In some embodiments, the processing logic implemented by the logic array and the LUTs can re-program itself based on conditions detected in the logic, data, and results. Such intelligent logic can be part of an AI training engine or a fuzzy logic. In some cases, such logic may need to perform checkpoints in order to always have a good known state of itself for a possible roll-back from an erroneous state. With respect to parsing strings against context-free grammars as described herein, this feature would allow evolving the set of grammar rules G based on certain conditions and projections. Such evolution can be compared to evolution of a natural language or evolution of a programming language. When applied to programming languages, this feature can be useful for incorporating language optimizations into the language, which can be evidenced in subsequent language standard releases (e.g. C++03, C++11, C++14, C++17, etc.). Another example of this evolution feature is genome sequencing and utilization of artificial genes in genetic algorithms and genetic programming.

As noted herein above, PIM systems operating in accordance with aspects of the present disclosure can implement the processing logic 330 of FIG. 3 encoding a set of context-free grammar rule to be utilized by the CYK parser. In other illustrative examples, PIM systems operating in accordance with aspects of the present disclosure can be employed for implementing various other pipelines, examples of which are described in more detail herein below. Those pipelines may as well implement CYK parser in its entirety of as being a part of a larger and/or more generic computational system.

In some embodiments, the control block 120 can implement a simple reduced instruction set computer (RISC) pipeline with no speculation and no instruction-level parallelism. In other embodiments, the control block 120 can implement at least some instruction-level parallelism and out-of-order execution, thus implementing Tomasulo or scoreboarding-type computational pipelines (i.e., complex instruction set computer (CISC) pipelines).

In some embodiments, the control block 120 can implement a Single Instruction Multiple Data (SIMD) computational pipeline, by employing multiple processing elements that simultaneously perform the same operation on multiple data items simultaneously. Such embodiments can implement very efficient solutions for matrix multiplication and dot-product operations. A SIMD-style pipeline can be RISC or CISC type. Furthermore, a SIMD pipeline can be implemented as a very long instruction word (VLIW) pipeline for exploiting more instruction-level parallelism.

Thus, in some implementations, a computing system for implementing a parser for context-free grammars includes a memory array, a logic array coupled to the memory array, and a control block coupled to the memory array and the logic array. The memory array can be employed to store one or more look-up tables (LUTs) and data comprising an input string. The logic array can be employed to perform a set of logic operations on the data and the LUTs, such that the set of logic operations implement a set of production rules of a context-free grammar for translate the input string into one or more non-terminal symbols of an alphabet. The control block can control, by activating one or more LUTs, the computational pipeline implementing the parser evaluating the input string against the context-free grammar. The parser implemented by the computational pipeline can iteratively identify sequences of one or more grammar states of the context-free grammar, each sequence of grammar states deriving a substring of the input string.

The parser generates a CYK parse tree represented by a table, the table of which are computed by recursively feeding the data from the previously computed cells to the processing logic 330 of FIG. 3, as described in more detail herein above. The table calls can be computed and stored in a bit-parallel fashion, such that each row of the CYK rows takes on or more memory rows electrically coupled to the respective wordlines and stored in respective bitlines (or groups of thereof).

Figure 6:
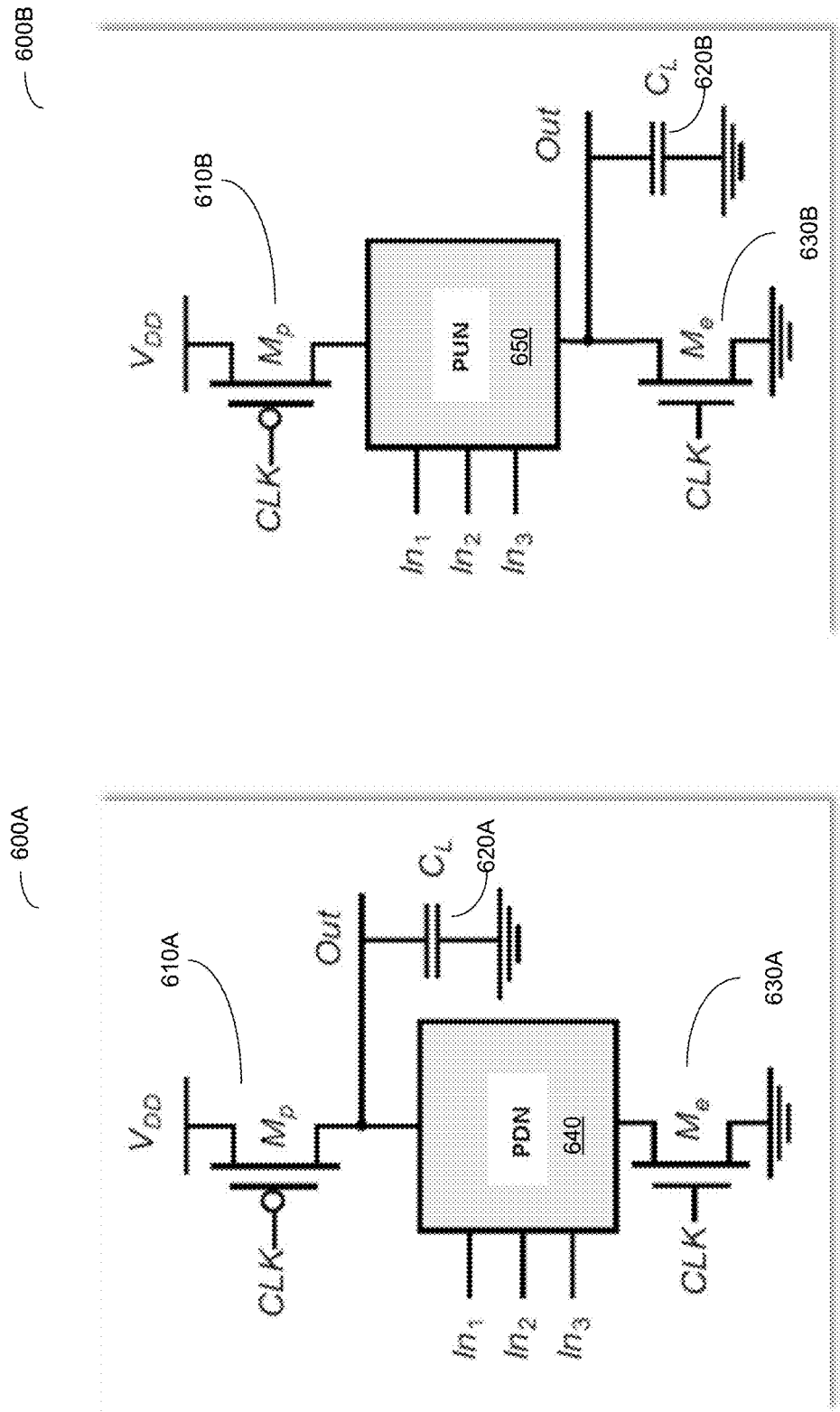
FIG. 6 schematically illustrates high-level component diagrams of a pull-down network (PDN)-based configurable logic and a pull-up network (PUN)-based configurable logic implemented in accordance with aspects of the present disclosure.

In some embodiments, the memory array 110 can further implement configurable logic that employs pull networks (pull-up networks (PUNS) and/or pull-down networks (PDNs)) utilized for controlling the memory cells of the memory array 110, as schematically illustrated by FIG. 1B. In the illustrative example of FIG. 1B, the logic array 130 can be employed for implementing the pull networks controlling memory cells of the memory array 110, as schematically illustrated by FIG. 6.

In particular, a PDN-based configurable logic 600A can include a memory cell, which is formed by the access transistor 610A coupled to the capacitor 620A, and controlled by the PDN 640. The configurable logic operates in two phases: pre-charge and evaluation, each of which can be performed on a corresponding clock cycle. When the clock signal is low, thus opening the transistor 610A and closing the transistor 630A, the pre-charge phase is performed: the discharge path to the ground is blocked by the PDN 640, and the capacitor 660A is "pulled up," i.e., charged to the logical "1" level by the technology-specific nominal power supply voltage ($V_{dd}$) flowing through the transistor 610A. Conversely, the evaluation phase is performed when clock signal is high, thus closing the transistor 610A and opening the transistor 630A, a conditional path to the ground is enabled through the transistor 630A and the PDN 640. The capacitor 620A is discharged depending on the inputs $In_1, In_6, \ldots, In_n$, which define the state of the PDN 640, thus defining a path to the ground. In some instances, that path can be partial, thus providing multi-level voltage evaluation.

Similarly, a PUN-based configurable logic 600B can include a memory cell, which is formed by the access transistor 610B coupled to the capacitor 620B, and controlled by the PUN 650. The configurable logic operates in two phases: pre-charge and evaluation, each of which can be performed on a corresponding clock cycle.

The pre-charge phase is performed when the clock signal is high, thus blocking the charge path by closing the transistor 610B: the capacitor 620B is "pulled down," i.e., discharged to the ground through the transistor 630B. Conversely, the evaluation phase is performed when the clock signal is low, thus enabling a conditional path to the power supply voltage ($V_{dd}$) by closing the transistor 630B and opening the transistor 610B. Accordingly, the capacitor 620B is charged depending on the inputs $In_1, In_6, \ldots, In_n$, which define the state of the PUN 650, thus defining a path to the ground. In some instances, that path can be partial, thus providing multi-level voltage evaluation.

Referring again to FIG. 1B, the logic array 130 can be employed for implementing the configurable logic (e.g., represented by a pull network comprising a PDN, a PUN, or their combination) controlling operations of the memory array 110. While the illustrative example of FIG. 1B shows an example PDN 155, in various other implementations, the logic array can implement both PDNs and PUNS and/or their combinations for controlling the memory array 110.

As noted herein above, the configurable logic implemented by the logic array 130 operates in two phases: pre-charge and evaluation, each of which can be performed on a corresponding clock cycle. During the pre-charge phase, a chosen bitline 165 is conditionally pre-charged to a certain voltage by being coupled to a PUN/PDN capacitor. Alternatively, a bitline can be a part of the PUN/PDN capacitor, or can perform as the PUN/PDN capacitor. Furthermore, the logic array 130 may cause at least one wordline 170 to be open during the pre-charge, and thus the corresponding row(s) of memory cells is (are) pre-charged along with the column of memory cells that are addressed by the chosen bitline. The number of pre-charged rows can be used for balancing the amount of charge during the evaluation phase. Furthermore, different rows of memory cells can be pre-charged to different charge levels, which can be specified by the inputs provided by the control block 120. Thus, groups of memory cells on selected bitlines can be pre-charged with different logic according to the states of the respective pull networks. In some implementations, the pre-charge phase may be integrated into the memory interface protocol, and thus may be performed whenever a pre-charge instruction is issued by the memory controller.

During the evaluation phase, a chosen wordline conditionally opens and a corresponding row of memory cells is evaluated with the PDN 155, PUN (not shown in FIG. 1 for clarity and conciseness), or combination thereof. As a result, the charge held by the memory cells is either retained or leaked, depending on the state of the pull network. The result of the evaluation phase, which is the state of the bitline, can be recorded in a chosen row of the memory array 110. The process can be repeated for other rows of interest. Multiple passes can be performed on subsequent results by pull networks in order to compute the final result. This can be especially useful for recursive algorithms, including those used for parsing strings against context-free grammars, as described herein. The inputs $In_1, In_2, \ldots, In_n$ controlling the pull networks can be received from the control block (which, in turn, can receive its inputs from an external source) or can be routed, sequentially or in parallel, from a chosen bitline or a group of bitlines, which can be coupled to memory cells by opening certain wordlines as controlled by the control block.

In an illustrative example, a XOR logic gate can be implemented by pre-charging a first memory cell, access to which is controlled by a first word line on a chosen bitline, to a certain value and then accessing the value stored in the first memory cell by opening the first wordline, followed by evaluating the memory cell by another value that is supplied to the bitline directly or stored in a second memory cell coupled to the bitline. Observed voltage fluctuations would indicate that the first and second values are different, and thus the output of the XOR logic gate would be logical "1." Conversely, if no voltage fluctuations are observed, the values are indistinguishable, and the output of the XOR logic gate would be logical "0." In another example, a XOR logical gate can be similarly implemented by utilizing two adjacent bitlines, e.g. by coupling them in the same manner as described above with respect to first and second memory cells, and then routing this coupling via PUN/PDN components. In various illustrative examples, addition and multiplication operations may be performed by combining multiple XOR gates, each of which represents a half adder. Similarly, other types of logic gates can be implemented (AND, NAND, OR, NOR, NOT etc.).

In some implementations, the configurable logic (e.g., pull networks) controlling the memory cells can be implemented within the memory array 110. The pull network inputs $In_1, In_2, \ldots, In_n$ can be routed to respective wordlines, and the pull network logic can be stored in memory cells addressed by a chosen bitline at corresponding intersections with the wordlines, by pre-charging the memory cells to various charge values (voltage levels). During the evaluation phase, the wordlines will be open, this establishing new voltage states of the chosen bitline coupled to respective memory cells.

In an illustrative example, the in-memory configurable logic may be utilized for implementing a simple inverter. At the pre-charge phase, a selected memory row can be pre-charged to zero or negative voltage and its wordline can be closed thereafter. Furthermore, a selected bitline can be pre-charged to a positive voltage. During the evaluation phase, the input controlling the configurable logic is routed to the wordline: if the input is logical "0," then the wordline remains closed and the bitline remains at the positive voltage, while if the input is logical "1," then the wordline opens, thus causing the charge from the memory cell to cancel the charge on the bitline, which would invert its state from the positive to zero or negative state. Multiple bitlines can be engaged this way in parallel, thus producing a high-bandwidth logic array with in-memory configurable logic. As noted herein above, the inputs controlling the external logic can be received from the control block (which, in turn, can receive its inputs from an external source) or can be routed, sequentially or in parallel, from a chosen bitline or a group of bitlines.

Figure 7:
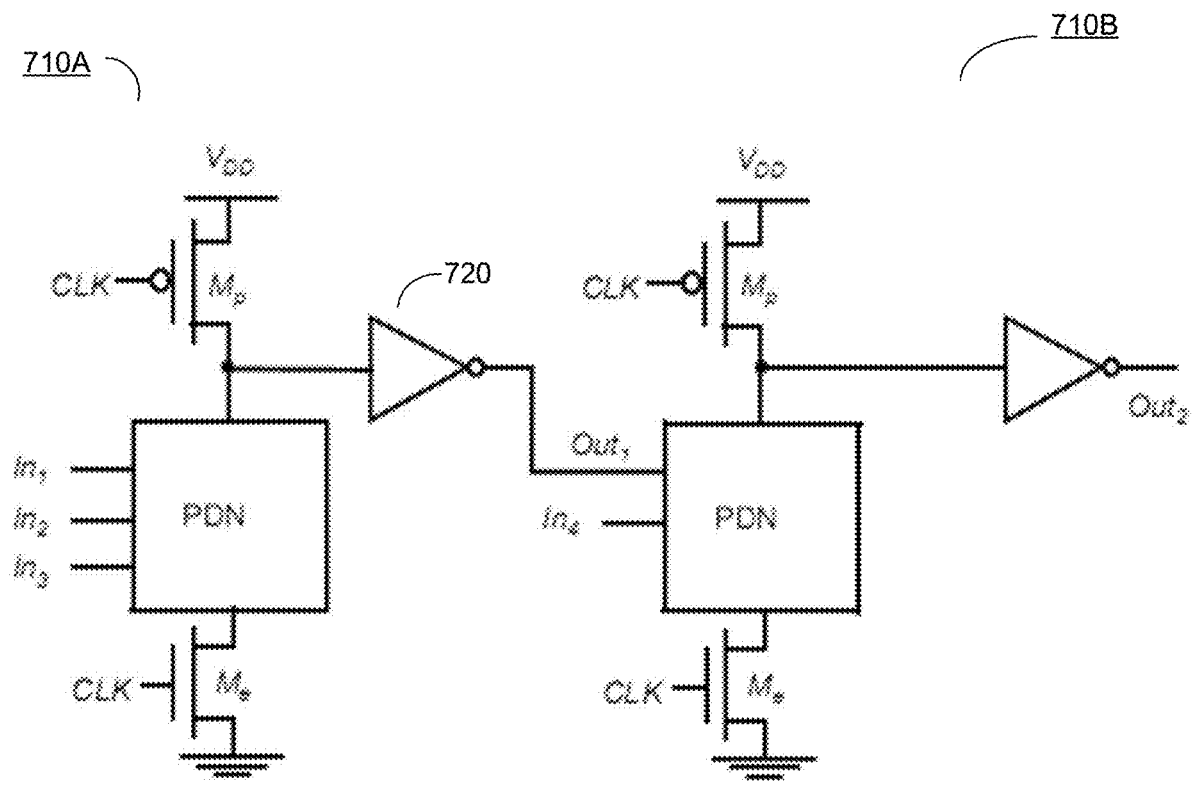
FIG. 7 illustrates a high-level component diagrams of a serially connected pull-network-based configurable logic implemented in accordance with aspects of the present disclosure.

Referring again to implementations of the configurable logic (e.g., pull networks) by the logic array 130, pull network-based configurable logic, such as example configurable logic cells 600A and 600B, can be connected in series via a buffer (e.g., an inverter), as schematically illustrated by FIG. 7. In the illustrative example of FIG. 7, the PDNs 710A and 710B are connected in series via the logical inverter 720.

Such pull network cascading allows implementation of complex sequential circuits for implementing parallel computational pipelines, e.g., comprising multiple copies of the processing logic 330 encoding the rule set of a context-free grammar to be used by algorithms that provide parsing strings against context-free grammars, as described herein, including the CYK parser. The copies of the processing logic 330 can be replicated and/or cascaded.

Thus, in some implementations, a computing system for implementing a parser for context-free grammars includes a memory array including plurality of memory cells electrically coupled to a plurality of wordlines and a plurality of bitlines, a logic array coupled to the memory array, and a control block coupled to the memory array and the logic array. The memory array can be employed to store data comprising an input string. The logic array can be employed to implement configurable logic controlling the plurality of memory cells. The control block can control a computational pipeline performing a set of logic operations on the data, the set of logic operations translating, by a set of production rules of a context-free grammar, an input string into one or more non-terminal symbols of an alphabet. The computational pipeline can implement a parser which evaluates the input string against the context-free grammar, by iteratively identifying sequences of one or more grammar states of the context-free grammar, such that each sequence of grammar states derives a substring of the input string.

Figure 8:
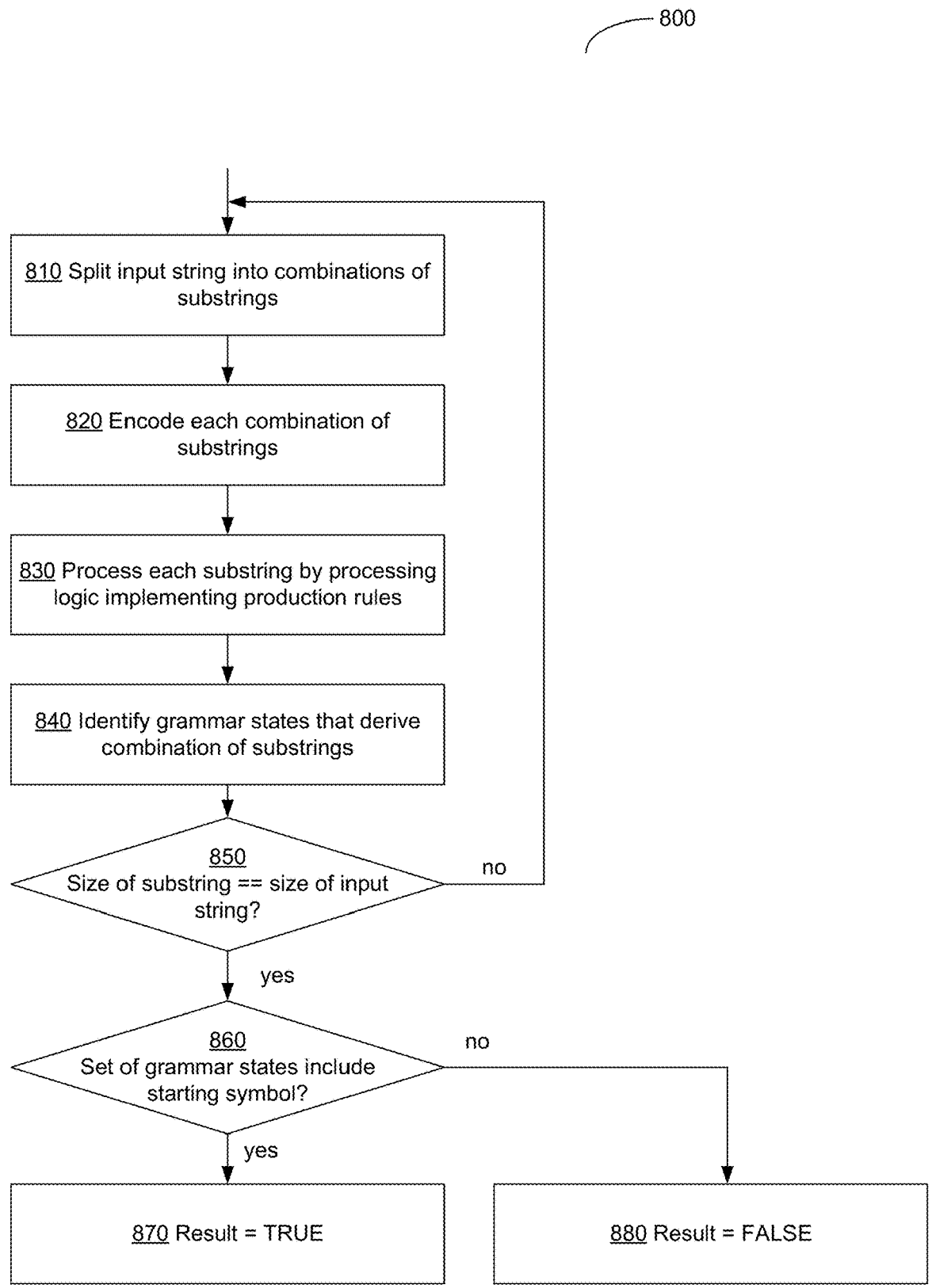
FIG. 8 is a flow diagram of an example method of implementing a parser for context-free grammars by a PIM system operating in accordance with some embodiments of the present disclosure.

FIG. 8 is a flow diagram of an example method of implementing a parser for a context-free grammar by a PIM system operating in accordance with some embodiments of the present disclosure. As noted herein above, the PIM system can include a memory array coupled to a control block, a logic array, and cache/registers memory. The computational pipeline can be specified by a sequence of executable instructions stored in the memory array or received via an I/O link.

In some embodiments, the method 800 is performed by the PIM system 100A of FIG. 1A or by the PIM system 100B of FIG. 1B. Although the operations of the method are shown in a particular sequence or order, the order of the operations can, unless otherwise specified, be modified. Thus, the illustrated embodiments should be understood only as examples, and the illustrated operations can be performed in a different order, while some operations can be performed in parallel. Additionally, in some embodiments, one or more operations can be omitted or more operations can be inserted. Thus, not all illustrated operations are required in every embodiment, and other process flows are possible.

At operation 810, the PIM system implementing the method splits an input string into a plurality of combinations of substrings of varying sizes ranging from single-symbol substrings at the first iteration to the whole string at the last iteration of the method. The splitting operation can involve identifying the positions of substrings within the input string, without actually moving or copying the identified substrings. In some embodiments, the splitting operation can be interleaved with other computational operations, and in some cases the splitting operation can be coded as a set of instructions such that the positions of substrings are linked with respective iterations of CYK algorithm or positions within the CYK table.

At operation 820, the PIM system encodes each combination of substrings by a chosen encoding, e.g., one-hot encoding. The encodings of each substring have been produced by the previous iteration of the method and stored in a memory data structure implementing the parse tree, as described in more detail herein above. The initial encodings can be predefined for all single-symbol substrings.

At operation 830, the PIM system processes encodings of each combinations of substring by feeding these combinations into the logic implementing the set of production rules of the context-free grammar, as described in more detail herein above.

At operation 840, the PIM system identifies, by decoding the output produced by the computing pipeline, one or more states of the context-free grammar that derive the combination of substrings. The states are saved in the memory data structure implementing the parse tree, as described in more detail herein above. The decoding can be optional and the states can remain encoded for subsequent iterations.

Responsive to determining, at operation 850, that the size of any substring within the current iteration is less than the size of the input string, the method loops back to operation 810.

Responsive to determining, at operation 860, that the set of grammar states corresponding to the sub string include the starting symbol S, the PIM system, at operation 870, outputs TRUE (i.e., the input string is compliant to the contest-free grammar); otherwise, the PIM system, at operation 880, outputs FALSE (i.e., the input string is not compliant to the contest-free grammar). The result produced by the PIM system can be utilized for natural language processing operations, implementing compilers of formal languages (e.g., programming languages), and/or performing various other tasks related to languages defined by context-free grammars.

Determining whether a sentence (a phrase, or a word) is present in the language (i.e., by performing grammar check and error identification) is the core feature of the parsers of strings against context-free grammars described herein. Furthermore, the implementations described herein may show how the sentence is constructed (by building parse trees). In some embodiments, given a weighted grammar, the implementations described herein can enumerate sentence constructs from the highest to the lowest probability, thus rating the language constructs from the most to least common, and therefore evaluating their eloquence and related linguistic and artistic aspects. In combination, the sentence construction and probability can be used for error correction, by identifying most common errors and methods of their corrections in various language constructs.

In an illustrative example, the error correction functionality can be facilitated by maintaining a look-up table implementing a key-value store in which the keys are the sets of bits representing encodings corresponding to an error state and the values are encodings representing the respective correct constructs. A similar approach involving a key-value store can be used for extracting the essential information and converting text from large volume with many details to smaller text with the main information only. This can be done by implementing a key-value store in which the keys are encodings of the most common constructs, and values represent their significance. A similar approach involving a key-value store can be used for automated question answering, such that the keys can represent encodings of essential information extracted from a question and values can represent sentences that answer the question.

Figure 9:
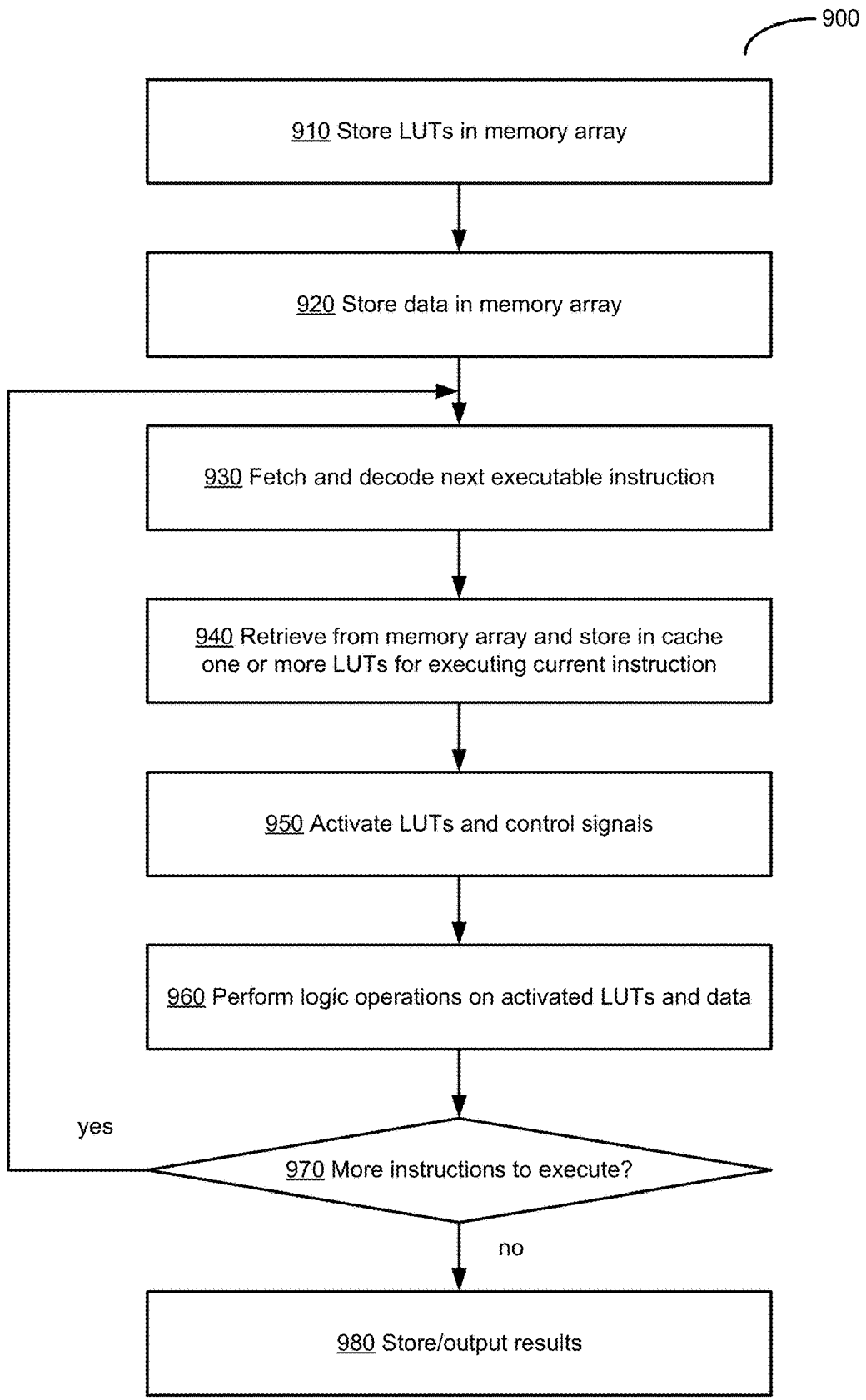
FIG. 9 is a flow diagram of an example method 900 of implementing a computational pipeline by a PIM system operating in accordance with some embodiments of the present disclosure.

FIG. 9 is a flow diagram of an example method 900 of implementing a computational pipeline by a PIM system operating in accordance with some embodiments of the present disclosure. As noted herein above, the PIM system can include a memory array coupled to a control block, a logic array, and cache/registers memory. The computational pipeline can be specified by a sequence of executable instructions stored in the memory array or received via an I/O link.

In some embodiments, the method 900 is performed by the PIM system 100A of FIG. 1A. Although the operations of the method are shown in a particular sequence or order, the order of the operations can, unless otherwise specified, be modified. Thus, the illustrated embodiments should be understood only as examples, and the illustrated operations can be performed in a different order, while some operations can be performed in parallel. Additionally, in some embodiments, one or more operations can be omitted or more operations can be inserted. Thus, not all illustrated operations are required in every embodiment, and other process flows are possible.

At operation 910, the PIM system implementing the method stores in the memory array a plurality of look-up tables (LUTs) implementing various logical and/or arithmetic operations, including operations implementing the parsers of strings against context-free grammars as described herein.

At operation 920, the PIM system stores in the memory array the data to be utilized for computations (e.g., the initial values to be supplied to the first executable instruction of the computational pipeline). In various illustrative examples, the data can include the strings, symbols and key-value stores used in parsing strings against context-free grammars, as described herein.

At operation 930, the control block fetches from the memory array (or from the cache) the next executable instruction and decodes the fetched instruction in order to determine the operation to be performed and its operands.

At operation 940, the control block of the PIM retrieves from the memory array and stores in the cache one or more LUTs to be utilized for executing the current instruction.

At operation 950, the control block of the PIM activates one or more LUTs to be utilized for the current executable instruction of the computational pipeline. The control block can further produces one or more control signals selecting one or more elements of the logic array utilized for the current executable instruction of the computational pipeline. In an illustrative example, the control block can, for each LUT activate a wordline in which a row of the LUT is stored that is identified by a combination of the inputs, as described in more detail herein above.

At operation 960, the logic array of the PIM performs, based on control inputs received from the control block, logic operations on the activated LUTs and the data.

Responsive to determining, at operation 970, that the computational pipeline includes further executable instructions, the method can loop back to operation 930. Otherwise, at operation 980, the results produced by the computational pipeline are stored in the memory array and/or outputted via an I/O interface, and the method terminates, optionally triggering other methods that are dependent on the results computed by this method.

Figure 10:
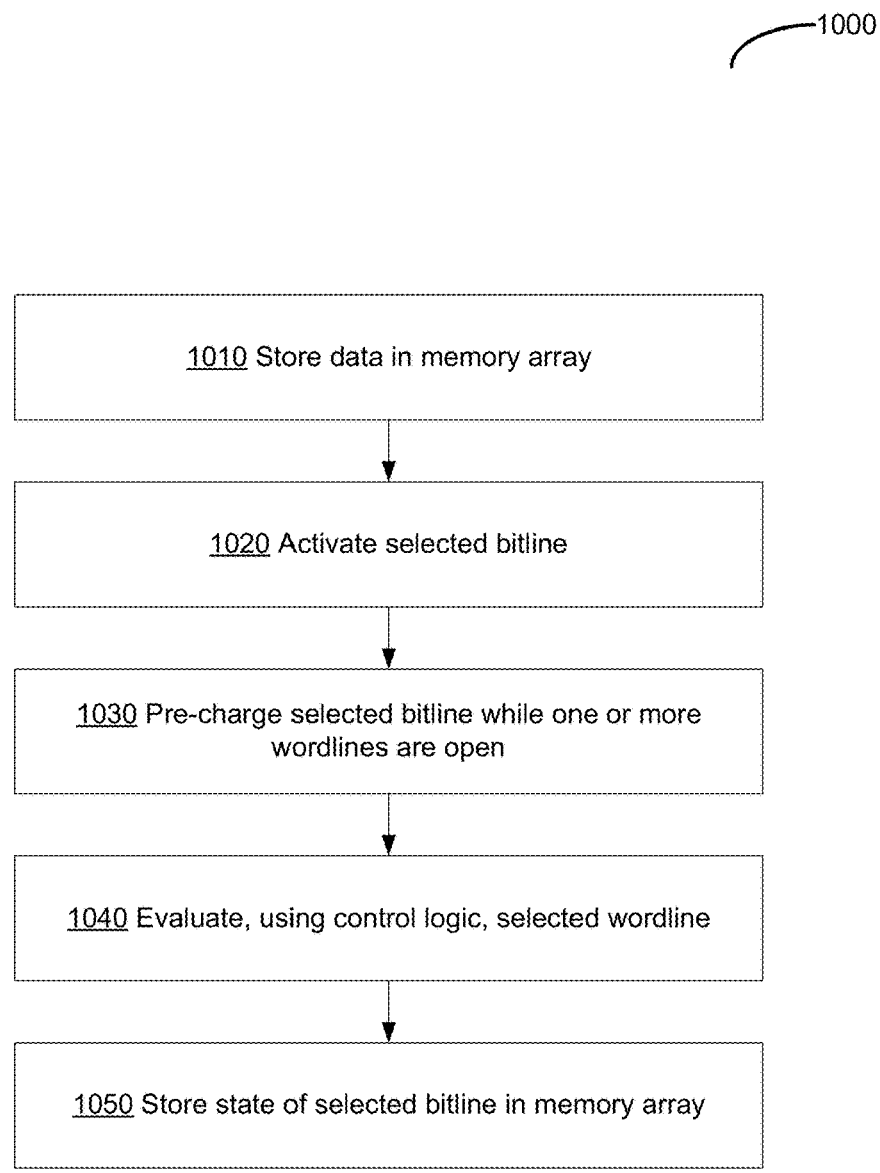
FIG. 10 is a flow diagram of an example method 1000 of implementing a computational pipeline by a PIM system operating in accordance with some embodiments of the present disclosure.

FIG. 10 is a flow diagram of an example method 1000 of implementing a computational pipeline by a PIM system operating in accordance with some embodiments of the present disclosure. As noted herein above, the PIM system can include a memory array coupled to a control block, a logic array, and cache/registers memory. The computational pipeline can be specified by a sequence of executable instructions stored in the memory array or received via an I/O link.

In some embodiments, the method 1000 is performed by the PIM system 100B of FIG. 1B. Although the operations of the method are shown in a particular sequence or order, the order of the operations can, unless otherwise specified, be modified. Thus, the illustrated embodiments should be understood only as examples, and the illustrated operations can be performed in a different order, while some operations can be performed in parallel. Additionally, in some embodiments, one or more operations can be omitted or more operations can be inserted. Thus, not all illustrated operations are required in every embodiment, and other process flows are possible.

At operation 1010, the PIM system implementing the method stores data in a memory array comprising a plurality of memory cells grouped into a plurality of wordlines and a plurality of bitlines. The data may include one or more initial data items for computations and one or more configuration data items for the control logic implemented by the memory array and/or the logic array of the PEW system.

At operation 1020, the control block of the PIM system activates a selected bitline of the plurality of bitlines. The bitline to be activated may be specified by a control input received from the control block of the PIM system, as described in more detail herein above.

At operation 1030, the PIM system pre-charges the selected bitline to a certain charge level (e.g., using a voltage level specified by a control input received from the control block), while at least one wordline of the plurality of wordlines is optionally open during the pre-charge operation, as described in more detail herein above. In some implementations, no wordlines can be open, while the bitline itself can be used as a capacitor for pre-charge operation.

At operation 1040, the PIM system evaluates, by the configurable logic, a row of memory cells addressed by a selected wordline which provides coupling of bitline with corresponding memory cell, and which may be specified by a control input received from the control block, as described in more detail herein above.

At operation 1050, the PIM system stores, in an available memory cell accessible via a wordline of the plurality of wordlines, a state of the selected bitline. The pre-charge, evaluate, and store operations may be repeated for multiple wordlines of interest, which may be specified by a control input received from the control block, as described in more detail herein above.

Figure 11:
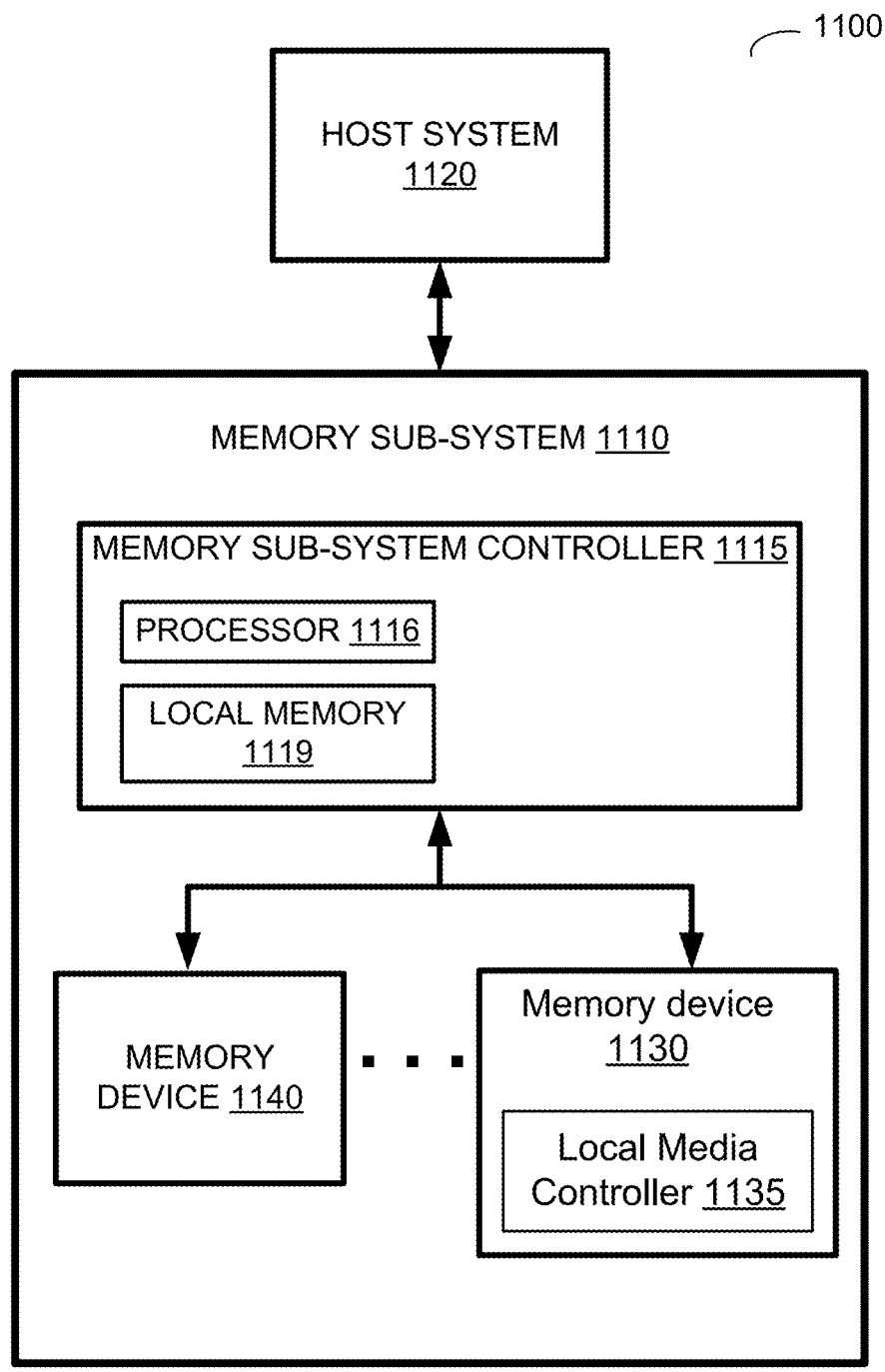
FIG. 11 illustrates an example computing system that includes a memory sub-system implemented in accordance with some embodiments of the present disclosure.

FIG. 11 illustrates an example computing system 1100 that includes a memory sub-system 1110 implemented in accordance with some embodiments of the present disclosure. The memory sub-system 1110 can include media, such as one or more volatile memory devices (e.g., memory device 1140), one or more non-volatile memory devices (e.g., memory device 1130), or a combination of such. In some embodiments, one or more memory devices 1140 can be utilized for implementing PIM systems operating in accordance with one or more aspects of the present disclosure. Accordingly, one or more memory devices 1140 can each include a memory array coupled to a control block, a logic array, and cache/registers memory, as described in more detail herein above with references to FIGS. 1A-1B.

The memory sub-system 1110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 1100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 1100 can include a host system 1120 that is coupled to one or more memory sub-systems 1110. In some embodiments, the host system 1120 is coupled to different types of memory sub-systems 1110. FIG. 11 illustrates one example of a host system 1120 coupled to one memory sub-system 1110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 1120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 1120 uses the memory sub-system 1110, for example, to write data to the memory sub-system 1110 and read data from the memory sub-system 1110.

The host system 1120 can be coupled to the memory sub-system 1110 via a physical host interface. Examples of a physical host interface include, but are not limited to, a serial advanced technology attachment (SATA) interface, a peripheral component interconnect express (PCIe) interface, CXL interface, CCIX interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 1120 and the memory sub-system 1110. The host system 1120 can further utilize an NVM Express (NVMe) interface to access components (e.g., memory devices 1130) when the memory sub-system 1110 is coupled with the host system 1120 by the PCIe interface 105. The physical host interface 105 can provide an interface for passing control, address, data, and other signals between the memory sub-system 1110 and the host system 1120. FIG. 11 illustrates a memory sub-system 1110 as an example. In general, the host system 1120 can access multiple memory sub-systems via a same communication connection, multiple separate communication connections, and/or a combination of communication connections.

In some embodiments, a dedicated processing core of a CPU of the host system 1120 can be controlled by a software driver to implement the functions of the PIM control block 120 of FIG. 1, as described in more detail herein above.

The memory devices 1130, 1140 can include any combination of the different types of non-volatile memory devices and/or volatile memory devices. The volatile memory devices (e.g., memory device 1140) can be, but are not limited to, random access memory (RAM), such as dynamic random access memory (DRAM) and synchronous dynamic random access memory (SDRAM).

Some examples of non-volatile memory devices (e.g., memory device 1130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 1130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 1130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 1130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 1130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 1115 can communicate with the memory devices 1130 to perform operations such as reading data, writing data, or erasing data at the memory devices 1130 and other such operations. The memory sub-system controller 1115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 1115 can be a microcontroller, special purpose logic circuitry (e.g., a field programmable gate array (FPGA), an application specific integrated circuit (ASIC), etc.), or other suitable processor.

The memory sub-system controller 1115 can include a processor 1116 (e.g., a processing device) configured to execute instructions stored in a local memory 1119. In the illustrated example, the local memory 1119 of the memory sub-system controller 1115 includes an embedded memory configured to store instructions for performing various processes, operations, logic flows, and routines that control operation of the memory sub-system 1110, including handling communications between the memory sub-system 1110 and the host system 1120. In some embodiments, the processor 1116 can be controlled by a software driver to implement the functions of the PIM control block 120 of FIG. 1, as described in more detail herein above.

In some embodiments, the local memory 1119 can include memory registers storing memory pointers, fetched data, etc. The local memory 1119 can also include read-only memory (ROM) for storing micro-code. While the example memory sub-system 1110 in FIG. 11 has been illustrated as including the controller 1115, in another embodiment of the present disclosure, a memory sub-system 1110 does not include a controller 1115, and can instead rely upon external control (e.g., provided by an external host, or by a processor or controller separate from the memory sub-system).

In general, the memory sub-system controller 1115 can receive commands or operations from the host system 1120 and can convert the commands or operations into instructions or appropriate commands to achieve the desired access to the memory devices 1130. The memory sub-system controller 1115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 1130. The memory sub-system controller 1115 can further include host interface circuitry to communicate with the host system 1120 via the physical host interface. The host interface circuitry can convert the commands received from the host system into command instructions to access the memory devices 1130 as well as convert responses associated with the memory devices 1130 into information for the host system 1120.

The memory sub-system 1110 can also include additional circuitry or components that are not illustrated. In some embodiments, the memory sub-system 1110 can include a cache or buffer (e.g., DRAM) and address circuitry (e.g., a row decoder and a column decoder) that can receive an address from the controller 1115 and decode the address to access the memory devices 1130.

In some embodiments, the memory devices 1130 include local media controllers 1135 that operate in conjunction with memory sub-system controller 1115 to execute operations on one or more memory cells of the memory devices 1130. An external controller (e.g., memory sub-system controller 1115) can externally manage the memory device 1130 (e.g., perform media management operations on the memory device 1130). In some embodiments, memory sub-system 1110 is a managed memory device, which is a raw memory device 1130 having control logic (e.g., local media controller 1135) on the die and a controller (e.g., memory sub-system controller 1115) for media management within the same memory device package. An example of a managed memory device is a managed NAND (MNAND) device.

Figure 12:
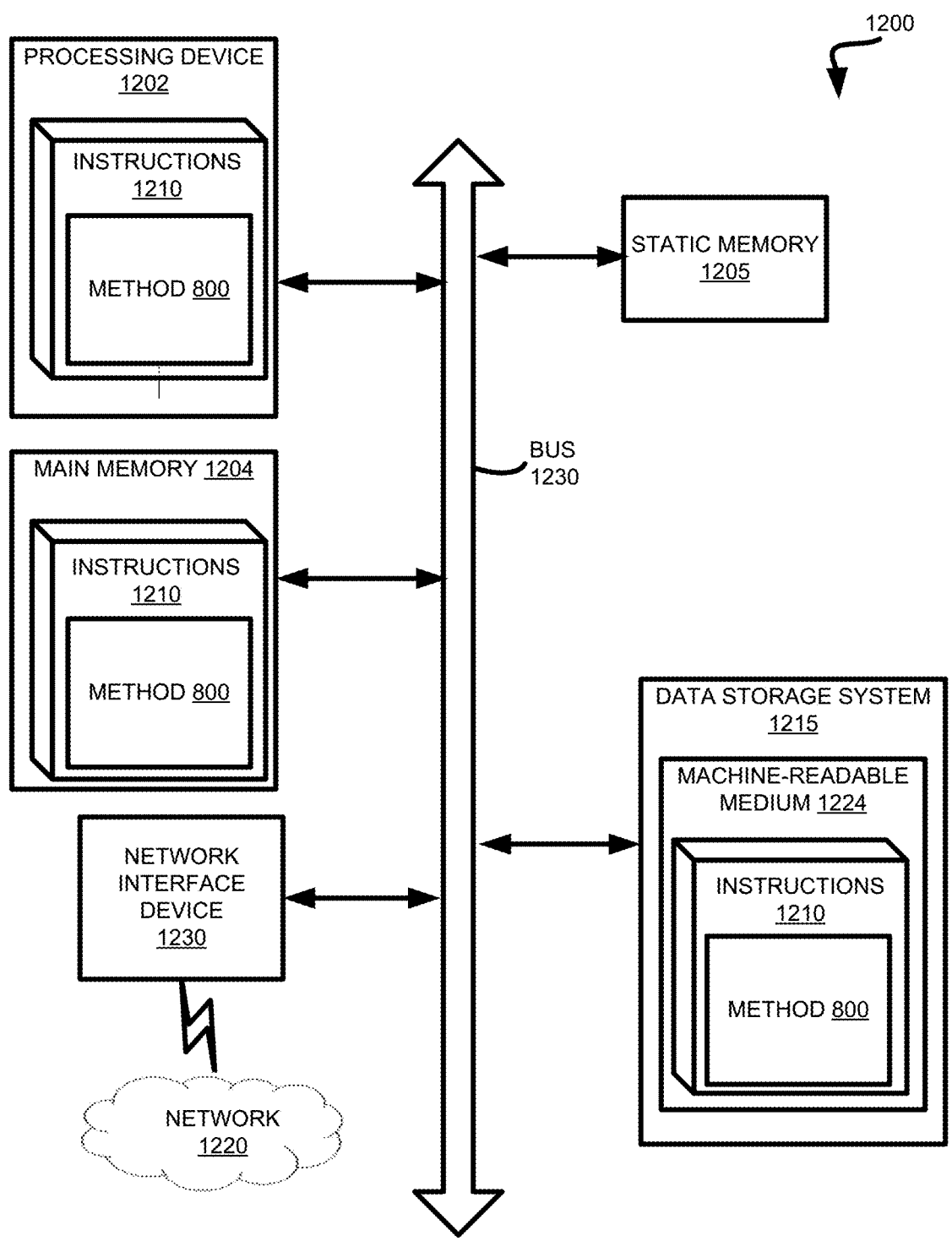
FIG. 12 is a block diagram of an example computer system in which embodiments of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 11) that includes, is coupled to, or utilizes a memory sub-system (e.g., the memory sub-system 110 of FIG. 11) or can be used to perform the operations of a controller.

In alternative embodiments, the machine can be connected (e.g., a network interface device 1230 coupled to the network 1220) to other computer system in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1205 (e.g., flash memory, static random access memory (SRAM), etc.), and a data storage system 1215, which communicate with each other via a bus 1230.

Processing device 1202 represents one or more general-purpose processing devices such as a microprocessor, a CPU, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1210 for performing the operations and steps discussed herein. In some embodiments, a dedicated processing core of a CPU 1202 can be controlled by a software driver to implement the functions of the PIM control block 120 of FIG. 1. In an illustrative example, the software driver can implement the example method 800, as described in more detail herein above.

The data storage system 1215 can include a machine-readable storage medium 1224 (also known as a computer-readable medium) on which is stored one or more sets of instructions 1210 or software embodying any one or more of the methodologies or functions described herein. The instructions 1210 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1215, and/or main memory 1204 can correspond to the memory sub-system 110 of FIG. 11.

In one embodiment, the instructions 1210 include instructions to implement the example method 800 of implementing a parser for context-free grammars by a PIM system operating in accordance with some embodiments of the present disclosure. While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the present disclosure have been described with reference to specific example embodiments thereof. It will be evident that various modifications can be made thereto without departing from the broader spirit and scope of embodiments of the present disclosure as set forth in the following claims. The specification and drawings are, accordingly, to be regarded in an illustrative sense rather than a restrictive sense.

What is claimed is:

1. A system, comprising:
a memory array to store a plurality of look-up tables (LUTs) and data comprising an input string;
a logic array coupled to the memory array, the logic array to perform a set of logic operations on the data and the LUTs, the set of logic operations implementing a set of production rules of a context-free grammar to translate the input string into one or more symbols; and
a control block coupled to the memory array and the logic array, the control block to control a computational pipeline by activating one or more LUTs of the plurality of LUTs, the computational pipeline implementing a parser evaluating the input string against the context-free grammar.

2. The system of claim 1, wherein the parser iteratively identifies sequences of one or more grammar states of the context-free grammar, each sequence of grammar states deriving a substring of the input string.

3. The system of claim 1, further comprising a cache coupled to the memory array and to the logic array, wherein the cache is utilized to store one or more LUTs of the plurality of LUTs.

4. The system of claim 1, wherein one or more LUTs of the plurality of LUTs implement one or more logic operations by storing one or more logic operation results in association with a look-up address comprising one or more logic operation inputs.

5. The system of claim 4, wherein the look-up address identifies a wordline of the memory array.

6. The system of claim 1, wherein the control block controls the logic array and the plurality of LUTs to implement one of: a single instruction multiple data (SIMD) computational pipeline, a very large instruction word (VLIW) computational pipeline, a scalar computational pipeline, or a computational pipeline of systolic arrays.

7. The system of claim 1, wherein the control block sequentially executes a set of executable instructions stored in the memory array.

8. The system of claim 1, implemented as a system-on-chip, the system further comprising:
   at least one processing core; and
   at least one input/output (I/O) interface.

9. A system, comprising:
   a memory array to store, by a plurality of memory cells electrically coupled to a plurality of wordlines and a plurality of bitlines, data comprising an input string;
   a logic array coupled to the memory array, the logic array to implement configurable logic controlling the plurality of memory cells; and
   a control block coupled to the memory array and the logic array, the control block to control a computational pipeline performing a set of logic operations on the data, the set of logic operations translating, by a set of production rules of a context-free grammar, an input string into one or more symbols.

10. The system of claim 9, wherein the computational pipeline implements a parser evaluating the input string against the context-free grammar.

11. The system of claim 9, wherein the parser iteratively identifies sequences of one or more grammar states of the context-free grammar, each sequence of grammar states deriving a substring of the input string.

12. The system of claim 9, wherein the control block is further to:
   pre-charge a selected bitline of the plurality of bitlines, wherein at least one wordline of the plurality of wordlines is open during the pre-charge operation; and
   evaluate, using the configurable logic, a row of memory cells addressed by a selected wordline.

13. The system of claim 12, wherein the control block is further to:
   store, in an available wordline of the plurality of wordlines, a state of the selected bitline.

14. The system of claim 9, wherein the configurable logic comprises at least one of: a pull-up network (PUN) or a pull-down network (PDN).

15. The system of claim 9, implemented as a system-on-chip, the system further comprising:
   at least one processing core; and
   at least one input/output (I/O) interface.

16. A method, comprising:
   splitting an input string into a plurality of combinations of substrings;
   processing an encoding of each combination of substrings by a processing-in-memory (PIM) pipeline encoding a set of production rules of a context-free grammar, wherein the PIM pipeline comprises a memory array comprising a plurality of memory cells electrically coupled to a plurality of wordlines and a plurality of bitlines, a control block coupled to the memory array, and a logic array coupled to the control block and to the memory array;
   identifying, by decoding an output produced by the PIM pipeline, one or more states of the context-free grammar that derive the input string.

17. The method of claim 16, wherein processing the encoding of each combination of substrings further comprises:
   storing, in the memory array, a plurality of look-up tables (LUTs);
   activating, by the control block, one or more LUTs of the plurality of LUTs; and
   performing, by the logic array, based on control inputs received from the control block, a set of logic operations on the activated LUTs, the set of logic operations implementing the set of production rules of the context-free grammar.

18. The method of claim 16, wherein processing the encoding of each combination of sub strings further comprises:
   storing data in the memory array;
   activating, by the control block, a selected bitline of the plurality of bitlines;
   pre-charging the selected bitline, wherein at least one wordline of the plurality of wordlines is open during the pre-charge operation; and
   evaluating, by a configurable logic implementing a set of logic operations, a row of memory cells addressed by a selected wordline, wherein the set of logic operations implements the set of production rules of the context-free grammar.

19. The method of claim 16, wherein one or more LUTs of the plurality of LUTs implement one or more logic operations by storing one or more logic operation results in association with a look-up address comprising one or more logic operation inputs.

20. The method of claim 16, wherein activating the LUTs is performed responsive to executing an instruction of a set of executable instructions stored in the memory array.

* * * * *